(12) United States Patent
Habitz

(10) Patent No.: US 7,089,129 B2
(45) Date of Patent: Aug. 8, 2006

(54) ELECTROMIGRATION CHECK OF SIGNAL NETS USING NET CAPACITANCE TO EVALUATE THERMAL CHARACTERISTICS

(75) Inventor: Peter A. Habitz, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,990

(22) Filed: Nov. 12, 2003

(65) Prior Publication Data
US 2005/0102117 A1 May 12, 2005

(51) Int. Cl.
*G06F 19/00* (2006.01)

(52) U.S. Cl. .......... 702/65; 702/136; 702/118; 702/64; 702/60; 716/5; 716/10

(58) Field of Classification Search .......... 702/65, 702/57–60, 64, 108, 117, 118, 124, 126, 132, 702/136, 196, 183; 703/13, 14, 18; 716/4, 716/5, 12, 10; 438/468, 927; 700/121; 324/519, 324/765, 538, 600, 73.1, 141, 142, 170, 175, 324/178; 714/55; 257/767
See application file for complete search history.

(56) References Cited

U.S. PATENT DOCUMENTS

| | | | |
|---|---|---|---|
| 5,410,490 A | 4/1995 | Yastrow | 716/5 |
| 5,533,197 A * | 7/1996 | Moran et al. | 714/55 |
| 5,737,580 A | 4/1998 | Hathaway et al. | 716/12 |
| 5,831,867 A | 11/1998 | Aji et al. | 716/4 |
| 5,963,729 A | 10/1999 | Aji et al. | 716/5 |
| 5,995,732 A | 11/1999 | Murai | 716/5 |
| 6,038,383 A | 3/2000 | Young et al. | 716/5 |
| 6,072,945 A | 6/2000 | Aji et al. | 716/5 |
| 6,868,374 B1 * | 3/2005 | Ditlow et al. | 703/18 |
| 2003/0014201 A1 * | 1/2003 | Schultz | 702/64 |

* cited by examiner

*Primary Examiner*—Hal Wachsman
(74) *Attorney, Agent, or Firm*—Connolly, Bove, Lodge & Hutz LLP (57) ABSTRACT

A method for performing an electromigration check and detecting EM problems in a device or circuit. The method uses the capacitance and resistance of the conductors of the device or circuit as parameters in determining a power limit that maintains a required temperature environment that ensures the reliability of the device or circuit. The power limit is then used to check each device interconnect to identify the location of potential EM problems. Corrective action is taken to avoid EM problems as they are detected in the device or circuit.

23 Claims, 5 Drawing Sheets

Capacitance Matrix = $C = \begin{bmatrix} C_{11} & C_{12} & C_{13} \\ C_{21} & C_{22} & C_{23} \\ C_{31} & C_{32} & C_{33} \end{bmatrix}$ coupling capacitances = $C_{ni}$, where n, i = conductor numbers total capacitance = $C_{ntot} = \sum_{i=1}^{N} C_{ni}$, where N = the number of conductors

ELECTROMIGRATION CHECK OF SIGNAL NETS USING NET CAPACITANCE TO EVALUATE THERMAL CHARACTERISTICS

BACKGROUND OF INVENTION

1. Field of the Invention

The present invention is generally related to the field of integrated circuits, and more particularly related to a method for avoiding excessive local heating that creates electromigration in the metallic interconnects of an integrated circuit device.

2. Background of the Invention

Metallic interconnections of integrated circuit (IC) devices are subject to a degradation phenomena known as electromigration (EM). EM is caused by the electronic interactions of the metal atoms and ions in the conductors of an IC device. EM effects become more prominent as IC feature sizes decrease and as IC frequencies and current densities increase.

EM in IC devices occurs due to direct current flow. High direct current density in an IC device causes atoms and ions in the conductors of the device to move in the opposite direction of the direct current flow. In particular, when high direct current densities pass through thin conductors, metal ions accumulate in some regions and voids form in other regions of the conductors. The accumulation of metal ions may result in a short circuit to adjacent conductors and the voids may result in an open-circuit condition. However, if the current density can be kept below a predetermined EM threshold, EM can be rendered negligible for the life of any particular IC device. Therefore, EM due to direct current flow in IC devices is a major concern with respect to the potential for device failures and the overall reliability of the device.

IC devices may also have alternating current flow. The alternating current density in an IC device that results from alternating current flow causes atoms and ions in the conductors of the device to first move in one direction and then move in the opposite direction, back to their original positions. A plurality of conductors with alternating current flow are defined as a signal net. In contrast to conductors with direct current flow, conductors with alternating current flow do not directly cause EM problems. However, conductors with alternating current flow do use power and generate heat. Since EM is very sensitive to the temperature of the conductors, it is often necessary to limit the temperature increase of the conductors in IC devices that results from the heating due to alternating current flow. Therefore, the alternating current flow in a conductor does have an impact on EM because the heating due conductors with alternating current may increase the overall temperature of the IC device by heating up neighboring conductors with direct current flow.

As noted above, EM effects also become more prominent as IC feature size decreases. To counteract this effect, background art methods for controlling EM used wider conductor widths for an entire IC wiring network affected by EM. However, since EM problems become less severe as one moves away from a current source pin and toward each of the current sink pins of a wiring network, wider conductor widths are typically not required for the entire IC wiring network. Often, only a small segment of the IC wiring network needs the wider conductor width to eliminate EM problems for the entire IC wiring network. Therefore, these background art methods that use wider conductors throughout the IC wiring network often wastes valuable space on the IC device.

Other background art methods provide EM control by setting limits on the power dissipated in conductors with alternating current flow. In these background art methods adjacent conductors with direct current flow are only allowed to be heated by a maximum temperature difference $\Delta T_{MAX}$ in order to maintain the reliability of the IC device. In particular, to limit the heat generated as a result of the temperature difference $\Delta T$ caused by alternating current flow in adjacent conductors, a maximum root-mean-square (RMS) current limit ($I_{RMS}$) is set for all conductors with alternating current flow adjacent to a conductor with direct current flow. The maximum current limit is set by: (1) considering the minimum distance between conductors with alternating current flow and conductors with direct current flow; and (2) the maximum temperature difference $\Delta$-$T_{MAX}$ that maintains the reliability of the IC device. However, using this type of worst-case "minimum distance-between-conductors" approach to determine space between conductors also wastes valuable space on the IC device.

Therefore, there is a need to limit heating due to alternating current flow in an IC device by determining a power limit that provides device reliability due to excellent EM control and efficiently uses the space available on the IC device.

SUMMARY OF INVENTION

The present invention uses the capacitance and resistance of the conductors of an IC device as parameters in determining a power limit that maintains a required temperature environment that ensures the reliability of the device. The present invention provides an accurate method for determining the power limit based on these actual IC device parameters. These parameters can be determined from the IC device design through the use of commercially available device data or simulation and analysis tools. The present invention relaxes the requirements of background art methods for EM control that are based on the width of the conductors of the device or worst-case scenarios for minimum distances between conductors.

In regards to one aspect, the present invention comprises a method for performing an electromigration check for conductors with alternating current flow adjacent to conductors with direct current flow in an integrated circuit comprising: determining resistances $R_{WIRE}$ and a capacitance matrix C for the integrated circuit; converting the capacitance matrix C into a thermal conductance matrix G; determining temperature differences $\Delta T_{ni}$ between conductors from thermal conductances $G_{thi}$ of the thermal conductance matrix G; approximating power flow $P_n$ into conductors with direct current flow due to adjacent conductors with alternating current flow in the integrated circuit from the temperature differences $\Delta T_{ni}$ between conductors and the thermal conductances $G_{thi}$; determining a power limit as a function of the maximum temperature difference $\Delta T_{MAX}$ that ensures reliability of the integrated circuit; and performing the electromigration check by limiting power generated in the conductors with alternating current flow to less than the power limit.

In addition, another aspect of the present invention is a method for performing an electromigration check for conductors with alternating current flow adjacent to conductors with direct current flow comprising: determining resistances $R_{WIRE}$ and capacitances $C_{ni}$ for conductors with alternating current flow and conductors with direct current flow; converting the capacitances $C_{ni}$ into thermal conductances $G_{thi}$; determining temperature differences $\Delta T_{ni}$ between conductors from the thermal conductances $G_{thi}$; approximating power flow $P_n$ into conductors with direct current flow due to adjacent conductors with alternating current flow from the temperature differences $\Delta T_{ni}$ between conductors and thermal conductances $G_{thi}$; determining a power limit as a function of a maximum temperature difference $\Delta T_{MAX}$ for the conductors that ensures reliability of the conductor; and performing the electromigration check by limiting power generated in the conductors with alternating current flow to less than the power limit.

Further, in respect to still another aspect, the present invention is a method for performing a check of local heating in a device comprising: determining resistances $R_{WIRE}$ and at least one of capacitances $C_{ni}$ and a capacitance matrix C for the device; determining thermal conductances $G_{thi}$ from the at least one of capacitances $C_{ni}$ and a capacitance matrix C; setting a maximum temperature difference $\Delta T_{MAX}$ in accordance with electromigration requirements; determining a power limit $F*C_{ntot}*\Delta T_{MAX}$ as a function of the maximum temperature difference $\Delta_{MAX}$; checking each interconnect conductor with an alternating current flow to determine if power generated $I_{RMS}*R_{WIRE}^2$ is less than the power limit $F*C_{ntot}*\Delta T_{MAX}$; indicating no local heating problem with current interconnect conductor when power generated $I_{RMS}*R_{WIRE}^2$ is less than the power limit $F*C_{ntot}*\Delta T_{MAX}$; indicating a local heating problem exist with current interconnect conductor when the power generated $I_{RMS}*R_{WIRE}^2$ is equal to or greater than power limit $F*C_{ntot}*\Delta T_{MAX}$ and taking corrective action to reduce the power generated $I_{RMS}*R_{WIRE}^2$; and continuing to check each interconnect conductor with alternating current flow until all interconnect conductors have a value for power generated $I_{RMS}*R_{WIRE}^2$ less than the power limit $F*C_{ntot}*\Delta T_{MAX}$.

In accordance with another aspect of the present invention, the method provides an accurate and efficient way to evaluate the temperature difference ($\Delta T$) that a conductor with alternating current flow can cause in the temperature environment of an IC device. In accordance with yet another aspect of the present invention, the method: (1) evaluates the possible heat flow in the final layout of an IC device design; (2) improves the accuracy in determining the maximum current specified for EM control of the IC device; and (3) provides a computationally efficient approach for determining a power limit that provides for EM control.

BRIEF DESCRIPTION OF DRAWINGS

Several embodiments of the invention will now be further described in the following more detailed description of the specification when read with reference to the accompanying drawings in which.

DETAILED DESCRIPTION

Relationships exist between electrostatic systems and thermostatic systems that can be used in analyzing complex heat flow problems related to EM in IC devices. In particular, the behavior of charge flux density D in an electrical circuit system is analogous to the behavior of heat flux density Φ in a thermal heat flow system. The analogous behavior of these two types of flux densities can be used to link the methods used for the analysis of elements in electrical and thermal systems.

To see the mathematical basis for the relationship between electrical and thermal systems, one may first write Poisson's equation for a static electrical field E in a conductor as:

$$\nabla \cdot (\epsilon \cdot E) = -\rho \quad (1a)$$

where:

$$\nabla = \frac{\partial}{\partial x}\hat{i} + \frac{\partial}{\partial y}\hat{j} + \frac{\partial}{\partial z}\hat{k};$$

E=strength of the electric field;

$\epsilon$=permittivity of the electric field region; and $\rho$=charge density of the electric field region.

Next, by using the expression for charge flux density, $D=\epsilon E=-\epsilon\nabla V$, Poisson's equation (1a) can be rewritten in terms of the voltage gradient $\nabla V$ as:

$$\nabla \cdot (\epsilon \cdot \nabla V) = -\rho \quad (1b)$$

where:

$\nabla V = \nabla V(x,y,z)$=voltage gradient.

The heat equation for a thermostatic system can be written as:

$$\nabla \cdot (\kappa \cdot \nabla T) = -P_d \quad (2)$$

where:

$\nabla T = \nabla T(x,y,z)$=temperature gradient;

$\kappa = \kappa(x,y,z)$=thermal conductivity $P_d$=power density

As illustrated above, Poisson's equation, as given in Equations (1 b), and the heat equation, as given in Equation (2), have the same format. Thus, the heat equation for thermostatic systems can be analyzed through the application of the same simulation and analysis tools used to analyze and determine solutions for Poisson's equation for electrostatic systems. As indicated in Equation (1 b), charge flux density D and the electric field strength E are proportional to the voltage gradient $\nabla V$ in an electrical system. In addition, as indicated by Equation (2), heat flux φ is proportional to the temperature gradient $\nabla T$ in a thermal system. These relationships between electrical and thermal systems can be exploited in solving heat problems by mapping charge Q and voltage V in the electrical system to work w and temperature T in the thermal system, respectively. Moreover, additional analogies exist between the thermal system elements of thermal capacitance $C_{thi}$, thermal conductance $G_{thi}$, and the power flow through a thermal conductance $P_{Gthi}$ and comparable elements in an electrical system, as indicated in Table I and Table II.

TABLE I

Analogies Between Electrical and Thermal Systems

| Electrical Systems | | Thermal Systems | |
|---|---|---|---|
| $C\dfrac{dV}{dt} = \sum_i \dfrac{\Delta V_i}{R_i} + I_{source}$ | | $\rho C_h \Delta x \Delta y \Delta z \dfrac{\partial T}{\partial t} = \nabla \cdot (\kappa \Delta T) \Delta x \Delta y \Delta z + P_{source}$ | |
| $[Q/V][V/s] = [V_i/R_i] + [I_{source}]$ | | $[g/cm^3][J/gK][cm^3][K/s] = [1/cm][W/cm\cdot K][K/cm][cm^3] + [W]$ | |
| Charge, Q | Coulombs | Energy, e or Work, w | Joules |
| Voltage, V = V(x, y, z) | Volts | Temperature, T = T(x, y, z) | °K |
| Capacitance, C = Q/V | Farads= | Thermal Capacitance, $C_{th} = \rho C_h \Delta x \Delta y \Delta z$ | Joules/°K |
| Current, I = CdV/dt = dQ/dt | Amperes | Power, P = dw/dt | Watts = Joules/sec |
| Resistance, R = ΔV/I | Ω = | Thermal Resistance, $R_{th} = \Delta T/P$ | °K/Watts |
| Conductance, R = I/ΔV | Volts/Amp | Thermal Conductance, $G_{th} = P/\Delta T$ | Watts/°K |
| Electrical Conductivity, σ | Amperes/(cm-Volts) | Thermal conductivity; $\kappa = \kappa(x, yz)$ | Watts/(cm-°K) |
| Electric Flux or Current Density, $\nabla V = -E, J = \sigma E = -\sigma \nabla V$ | Amperes/cm² | Heat Flux, $\Phi = \kappa \nabla T$, | Watts/cm² |
| Current flow through a resistor, I = ΔV/R | Amperes = coulombs/sec | Power flow into the volume ΔxΔyΔz, $P = (-\nabla \cdot \Phi)\Delta x \Delta y \Delta z = (\nabla \cdot (\kappa \nabla T))\Delta x \Delta y \Delta z \approx \sum_i G_{thi}\Delta T,$ For heat flow in the z direction, $R_{thz} = \dfrac{1}{\kappa}\dfrac{\Delta z}{\Delta y \Delta z}$ Power flow for a thermal conductor, $P_{gth} = G_{th}\Delta T$ | Watts = Joules/sec |

TABLE II

Analogies Between Poisson's Equation of Electrostatics and the Heat Equation of Thermostatics (Assuming the time dependence of the thermal system is not of importance for the problem: i.e., ∂T/∂t is ignored)

| Poisson's Equation | | Heat Equation | |
|---|---|---|---|
| $\nabla \cdot (\epsilon \cdot \nabla V) = -\rho$ [l/cm][Farads/cm][Volts/cm] = [Coulombs/cm³] Charge density, ρ | | $\nabla \cdot (\kappa \cdot \nabla T) = -P_d$ [l/cm][Watts/cm · °K.][°K./cm] = [Watts/cm⁻³] Power density, $P_d$ | |
| Charge, Q | Coulombs | Work, w, Power, P | Joules Watts = Joules/sec |
| Voltage, V = V(x, y, z) | Volts | Temperature, T = T(x, y, z) | °K. |
| Capacitance, C = Q/V | Farads or Coulombs/Volts | Thermal Capacitance, $C_{th}=\Delta x \Delta y \Delta z\, \rho C_h$ | Joules/°K. |
| Charge Flux, $D = \epsilon E = -\epsilon \nabla V$ | Coulombs/cm² | Heat Flux, $\Phi = -\kappa \nabla T$, | Watts/cm² |
| permittivity, $\epsilon = \epsilon(x, y, z)$ | Farads/cm or Coulombs/(cm-Volts) | Thermal conductivity; $\kappa = \kappa(x, y, z)$ | Watts/(cm-°K.) |

In accordance with the above discussion, tools for the simulation and analysis of Poisson's equation and IC device interconnects can also be applied to solving the heat equation. Non-limiting examples of such tools include but are not limited to the electrical circuit simulators Hspice, Raphael, c2d, and any electromagnetic field or Poisson problem solvers. Each of these tools often includes capacitance and/or resistance extraction capabilities. In addition, these tools often include the ability to determine temperature distributions and temperature differences ΔT in IC devices that also can be used in the analysis and simulation of thermal heat flow problems.

In particular, one aspect of capacitance extraction tools is determining individual capacitances $C_{ni}$ or the capacitance matrix C for an IC device. The components of the capacitance matrix C include: (1) the diagonal components $C_{nn}$ are the capacitance to ground or reference of the capacitance matrix that and (2) the off-diagonal components $C_{ni}$ are the coupling capacitances. The sum of a row of the capacitance matrix C is the total capacitance $C_{ntot}$.

Considering Poisson's equation, which is shown in Equation (1b) as:

$$\nabla \cdot (\epsilon \cdot \nabla V) = -\rho,$$

where:

∇V=voltage gradient;

ε=permittivity of the electric field region; and

ρ=charge density of the electric field region, we note that permittivity ε is close to zero within a conductor. Thus, the permitivity function ε(x,y,z) contains a description of the geometry of the system relative to the coordinates of the conductors. Further, integration of Poisson's equation over (x,y,z)-space can be performed assuming a boundary condition of constant potential for the applied voltage within the conductor. The integration of Poisson's equation produces the capacitance matrix C of capacitances $C_{ni}$ between the conductors that describes the charges on the conductors as a result of the applied voltages.

Similarly, considering the heat equation, which is shown in Equation (2) as:

$$\nabla \cdot (\kappa \cdot \nabla T) = -P_d,$$

where:

∇T=temperature gradient;

κ=thermal conductivity; and $P_d$=power density, we note that the thermal conductivity κ between metal conductors is significantly smaller than within a conductor. Thus, the thermal conductivity function κ(x,y,z) contains a description of the geometry of the system relative to the coordinates of the conductors. Therefore, in the thermal case, we can also: (1) make the approximation that the temperature within the conductor is constant; (2) set this constant as a boundary condition at a given value; and (3) solve the heat equation. The result is a matrix G of thermal conductances $G_{thi}$ between conductors that describes the steady-state power flow between conductors with different temperatures.

The approximation discussed above for the thermal case is not as good as the electrical case since the difference in the thermal conductivity between insulator and conductor is only one to two orders of magnitude. In contrast, in the electrical case the different regions are several orders of magnitude different. However, accepting the approximation discussed above, both the Poisson and the heat equation become identical except for a scalar factor F. The scalar factor F describes the relationship between thermal conductivity ($\kappa$)_and electrical permittivity ($\epsilon$)_for a given material. The scalar factor F is given as:

$$F=\kappa/\epsilon.$$

Using the scalar factor F, either Poisson's equation or the heat equation can be solved for this application. However, since the capacitances $C_{ni}$ are needed for the electrical analysis of an IC device, solving Poisson's equation for the capacitance matrices C is simpler because these values are generally already calculated of available. Thus, the capacitance matrices C that result from analysis of Poisson's equation and an IC device can also be used for the thermal analysis of the device. That is, there is a simple relationship:

$$G=F*C$$

or $$G_{thi}=F*C_{ni},$$

where:
G=conductance matrix;
$G_{ni}$=thermal conductances
F=scalar factor;
C=capacitance matrix; and
$C_{ni}$=capacitances,
that can be used to evaluate the thermal conductance matrix G and thermal conductances $G_{thi}$ from the capacitance matrix C and capacitances $C_{ni}$, respectively.

Figure 1A:
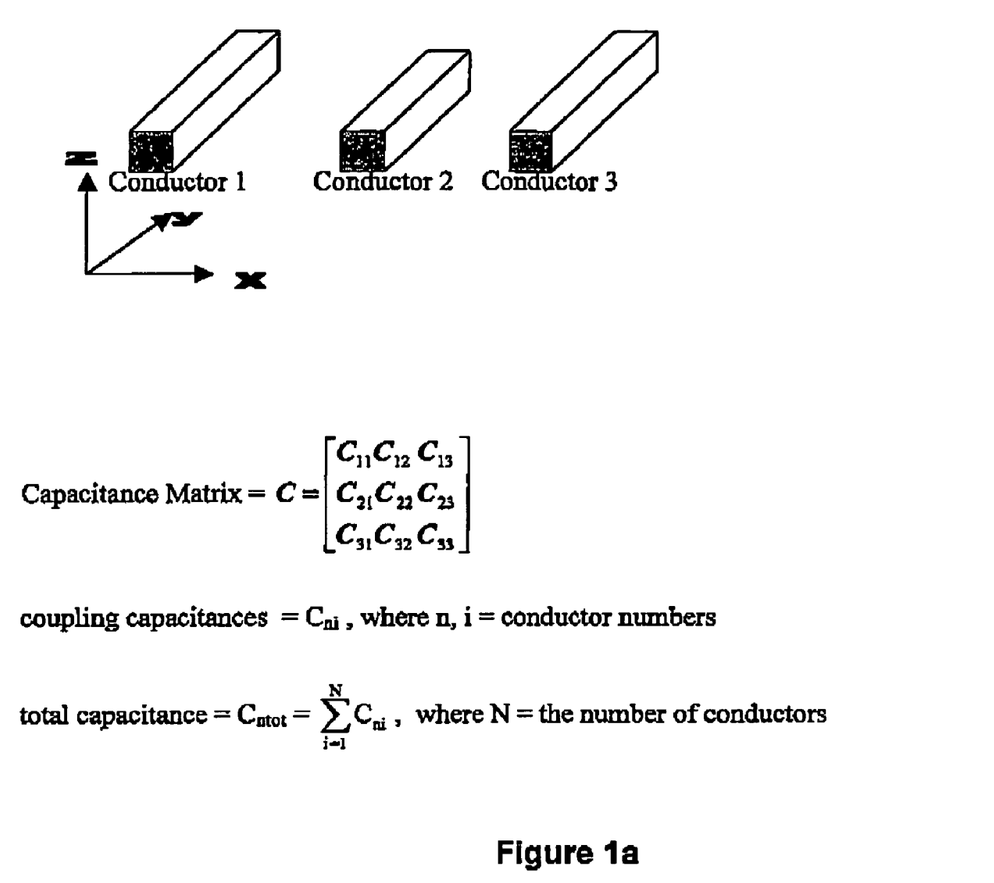
FIG. 1a shows a cross-section of conductors in a plane of the x-y-z axes that is exemplary of an integration method.

The situation discussed above is further illustrated in FIG. 1a. An integration over the geometry of conductor 1, conductor 2, and conductor 3 can be done from negative infinity to positive infinity with a three-dimensional finite element problem solver (e.g., FEMLAB) along x, y, and z axes, as shown in FIG. 1a. Either the voltage or temperature is set to a constant on the surface of the conductor to establish the boundary conditions. The three-dimensional finite element problem solver determines the familiar matrix equation between the conductors:

$$P_n = \sum_i^m \frac{\Delta T_{ni}}{R_{thi}} = \sum_i^m G_{thi} \Delta T_{ni}, \qquad (3a)$$

where:
$P_n$=power flowing into the nth conductor with direct current conductor from m adjacent conductors with alternating current flow;
$\Delta T_{ni}=T_n-T_i$=temperature difference at the nth conductor due to alternating current flow in conductor i;
$R_{thi}$=thermal resistance of conductor i;
$G_{thi}$=thermal conductance of conductor i; and
m=number of adjacent conductors with alternating current flow.

In particular, the case of three conductors in a single plane is shown in FIG. 1a. This corresponds to m=2 in Equation (3a). Additional examples would have included the two-dimensional case where m=4 and the three-dimensional case where—m=6. The temperature difference $\Delta T_{ni}$ at the nth conductor due to the ith conductor is generated by the alternating current flow in the ith conductor.

Next, assume that all other conductors are at the same temperature. This simplifies Equation (3a) as follows:

$$P_n = \sum_i^m Gni*\Delta T_{ni} = G_{ntot}*\Delta T_{ntot}, \qquad (3b)$$

or equivalently:

$$P_n=F*C_{ntot}*\Delta T_{ntot}, \qquad (3c)$$

where: $G=F*C$ or $G_{thi}=F*C_{ni}$.

The summation over all i of Equation (3b) provides the total thermal conductance $G_{ntot}$ of the nth conductor with no other conductors switching and with a total temperature difference $\Delta T_{ntot}$. This is the thermal equivalent of the total load capacitance $C_{ntot}$ of the nth conductor to ground. Equation (3c) then gives the temperature difference $\Delta T_{ntot}$ of the nth conductor with power $P_n$ due to the m adjacent conductors with alternating current flow. Therefore, the total thermal conductivity $G_{ntot}$ of the nth conductor can be obtained from the total load capacitance $C_{ntot}$ of the nth conductor to ground. As discussed above, the value of $C_{ntot}$ is readily available from simulation and analysis tools used with the IC device.

Each of the m adjacent conductors with alternating current flow provides part of the power $P_n$ to the nth conductor with direct current flow. As discussed above, the temperature increase $\Delta T_{ni}$ due to the m adjacent conductors with alternating current flow needs to be limited for EM protection. Equation (3c) provides a method for determining the limit of the total temperature increase $\Delta T_{ntot}$ in the nth conductor with direct current due to each of the m adjacent alternating current conductors. Due to thermal superposition, the m temperature increases $\Delta T_{ni}$ are additive. Thus, the total temperature increase $\Delta T_{ntot}$ can not be larger than that provided by the sum of the temperature increases due to the m alternating current conductors adjacent to the direct current conductor. Since a conductor with direct current can only have two adjacent conductors with alternating current lying in the same plane (i.e., the m=2 case shown in FIG. 1a), the limit of the total temperature increase $\Delta T_{ntot}$ in Equation (3c) is sufficient to limit the temperature increase in the conductor with direct current. This approach assumes that conductors with alternating current crossing above and below the plane containing the conductor with direct current have only a very small area of interaction and do not contribute significantly to the temperature increase $\Delta T_{ntot}$. That is, the influence of crossing alternating current conductors is neglected in the present invention.

As discussed above and shown in FIG. 1a, with m=2, Equation (3c) indicates that the temperature increase in a conductor with direct current flow can be limited by the power in the two adjacent conductors with alternating current flow. For example, when the adjacent conductors with alternating current flow are limited so each creates a temperature increase $\Delta T_{ni}$ of 2 degrees, the conductor with direct current flow has a temperature increase $\Delta T_{ntot}$ that cannot rise more than 4 degrees. Considering a 4 degree total temperature increase $\Delta T_{ntot}$, the power in each of the alternating current conductors is limited to $\Delta T_{NI}=2$ degrees as follows:

$$P_n < F^* C_{ntot}^* \Delta T_{MAX} \quad (3d)$$

Equation (3d) replaces background art methods that limit the power to a fixed value that, for example, depends on the width of the alternating current conductor. The method of the invention replaces the background art limit with the scalar factor F and the total capacitance $C_{ntot}$ of the nth conductor with direct current flow. With these additional elements, the present invention improves the resolution and simplifies the analysis of the EM threshold.

Figure 1B:
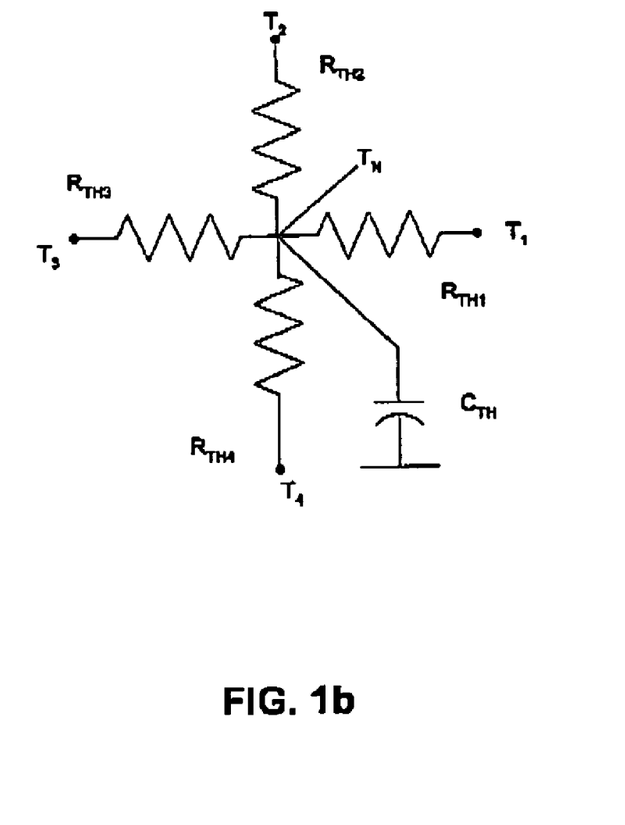
FIG. 1b shows an exemplary electrical circuit implementation demonstrating the concepts related to determining power flow $P_n$.

FIG. 1b shows an exemplary electrical circuit implementation that illustrates the concepts discussed above for determining the power flow $P_n$ in Equation (3a) in the two-dimensional case where m=4. FIG. 1b shows thermal resistances $R_{thi}$ of conductors with alternating current flow modeled as a circuit feeding power into a node n that has temperature $T_n$. Thermal conductances $G_{thi}$ could also have been used in the circuit. In addition, the thermal capacitance $C_{thi}$ is shown connected in the circuit model of FIG. 1b. The thermal capacitance $C_{thi}$ is responsible for: (1) storage of the temperature difference $\Delta T_{ni}$ between the nth conductor and ith conductor and (2) delays in the power flow $P_n$ into nth conductor. The values of $R_{thi}$ for i=1-4 can be entered in a circuit simulator as inputs and the values of $T_i$, are provided as outputs by the circuit simulator. The temperature differences $\Delta T_{ni}$ between conductors may then be used in Equation (3a) and the value of power flow $P_n$ into node n is determined.

As a non-limiting example of this method, consider a conductor (i.e., in this case the circuit node n) with temperature $T_n$ and a given $G_{thi}$ (i.e., in conductance per length). Equation (3a) can be written as:

$$P_n = \sum_i^m \Delta T_{ni} / R_{thi} = \sum_i^m G_{thi} \Delta T_{ni}, \text{ and}$$

where:

$T_n$=the temperature of the nth conductor with DC current flow;

$T_i$=the temperature of the ith adjacent conductor with AC current flow;

$\Delta T_{ni}=T_n-T_i$=the temperature difference between the nth conductor with direct current flow and ith conductor with alternating current flow;

m=the total number of conductors in close proximity with AC current flow;

$R_{thi}$=the thermal resistance for a wire of length 1; and $G_{thi}$=the thermal resistance for a wire of length 1.

In order to limit the maximum temperature difference $\Delta T_{MAX}$ in the nth conductor with direct current flow due to m adjacent conductors with alternating current flow, consider the expression of Equation (3d):

$$P_n < F^* C_{ntot}^* \Delta T_{MAX},$$

where $\Delta T_{MAX}$ is the maximum allowed temperature difference for a wire, conductor, or IC device that ensures reliability. A non-limiting example of the range allowed for this value is $0<\Delta T_{MAX}<5$. Since $P_i=I^2_{RMS}*R_{WIRE}$, Equation (3d) can be rewritten as:

$$I^2_{RMS}*R_{WIRE} < F^*C_{ntot}^*\Delta T_{MAX} => I_{RMS} < \\ ((F^*C_{ntot}^*\Delta T_{MAX})/R_{WIRE})^{1/2}, \quad (4)$$

where $R_{WIRE}$ is the resistance of the conductors that are provided as outputs of the simulation and analysis extraction tools discussed above; and $I_{RMS}$ is determined as:

$$I_{RMS}=C_{load}*V_{dd}*f*SF$$

where:

$C_{load}$=output capacitive load;

$V_{dd}$=supply voltage;

f=frequency; and

SF=switching factor.

IC device interconnects that meet the requirements of Equation (4) are guaranteed to achieve a maximum temperature difference $\Delta T_{MAX}$ due to alternating current flow that is less than the maximum temperature difference $\Delta T_{MAX}$ allowed for the IC device that ensures reliability. Thus, Equation (4) determines a power limit for a wire, conductor or IC device.

The power limit of Equation (4) is used to perform an electromigration check or check of the local heating of each of the interconnects of conductors with alternating current flow of an IC device according to a method comprising:

(a) determining the resistances $R_{WIRE}$ and capacitances $C_{ntot}$ and $C_{ni}$ of the IC device design;

(b) setting $\Delta T_{MAX}$ according to the EM requirements of the device;

(c) checking a power limit of all source to sink cell interconnects of a device;

(d) determining a power limit for every conductor with alternating current flow as:

$$F^*C_{ntot}^*\Delta T_{MAX},$$

(e) comparing the power generated $I^2_{RMS} R_{wire}$ in every conductor with alternating current flow to the power limit $F^*C_{ntot}^*\Delta T_{MAX}$ as follows:

$$I^2_{RMS} R_{wire} < F^*C_{ntot} \Delta T_{MAX} => I_{RMS} < \\ ((F^*C_{ntot}^*\Delta T_{MAX})/R_{WIRE})^{1/2};$$

(f) if power generated $I^2_{RMS} R_{wire}$ is less than the power limit $F^*C_{ntot}^*\Delta T_{MAX}$, then decide the interconnect fulfills the EM requirement, and move on to analyze the next interconnect in the design until all interconnects in the design have been checked; and (g) if power generated $I^2_{RMS} R_{wire}$ is greater than the power limit $F^*C_{ntot}^*\Delta T_{MAX}$, take corrective action, where non-limiting examples of corrective actions include but are not limited to reducing the power in a wire or conductor by widening the wire or conductor and reducing the value of $R_{WIRE}$. In addition, the capacitance matrix C, individual capacitances $C_{ni}$ and the resistances $R_{WIRE}$ can be extracted from simulation and analysis tools.

Figure 2:
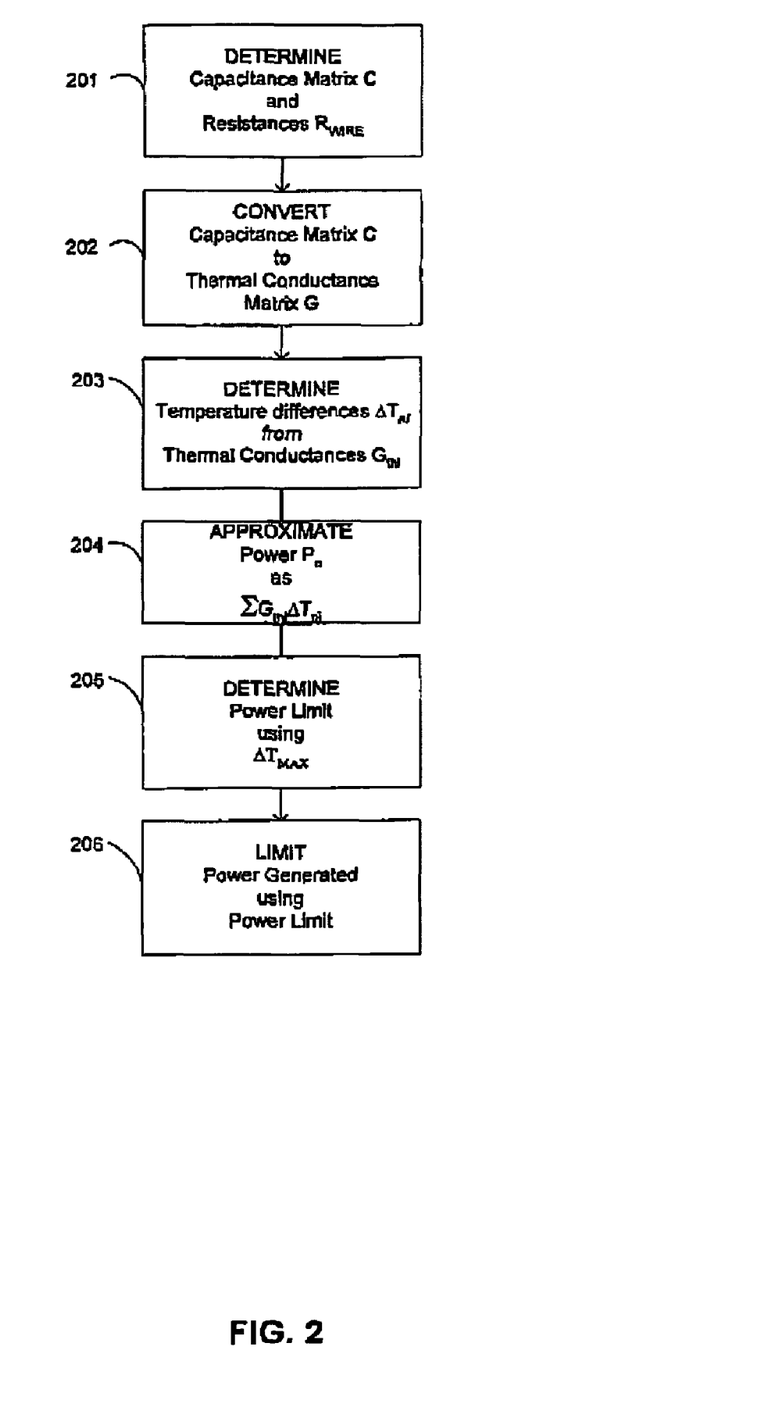
FIG. 2 is an exemplary flow diagram of the method for performing an electromigration check for conductors with alternating current flow adjacent to conductors with direct current flow in an integrated circuit.

FIG. 2 is an exemplary flow diagram of a method for performing an EM check for conductors with alternating current flow adjacent to conductors with direct current flow in an integrated circuit. The values for resistances $R_{WIRE}$ and capacitances $C_{ni}$ associated with the capacitance matrix C of the device are determined in step 201. A non-limiting example of the form in which these capacitances are provided is the capacitance matrix C. The values for capacitance $C_{ni}$ are converted into thermal conductances $G_{thi}$ by multiplying each value by the scalar factor F given by a ratio of thermal conductivity κ to permittivity ε of the material (i.e., F=κ/ε) at step 202. In step 203, the thermal conductances $G_{thi}$ are used to determine the temperature differences $\Delta T_{ni}$ between conductors. In step 204, the power flow $P_n$ into a nth conductor or wire with direct current flow is approximated by the summation of the product of the temperature differences $\Delta T_{ni}$ between conductors and the thermal conductances $G_{thi}$ due to alternating current flow in adjacent conductors or wires. The power limit is determined in step 205 using the maximum temperature difference $\Delta T_{MAX}$ that ensures the reliability for the wire, conductor or device being checked and the expression of Equation (4). This value for the power limit is used to limit the power generated in the conductors with alternating current flow adjacent to a conductor with direct current flow to a value less than the power limit in step 206.

Figure 3:
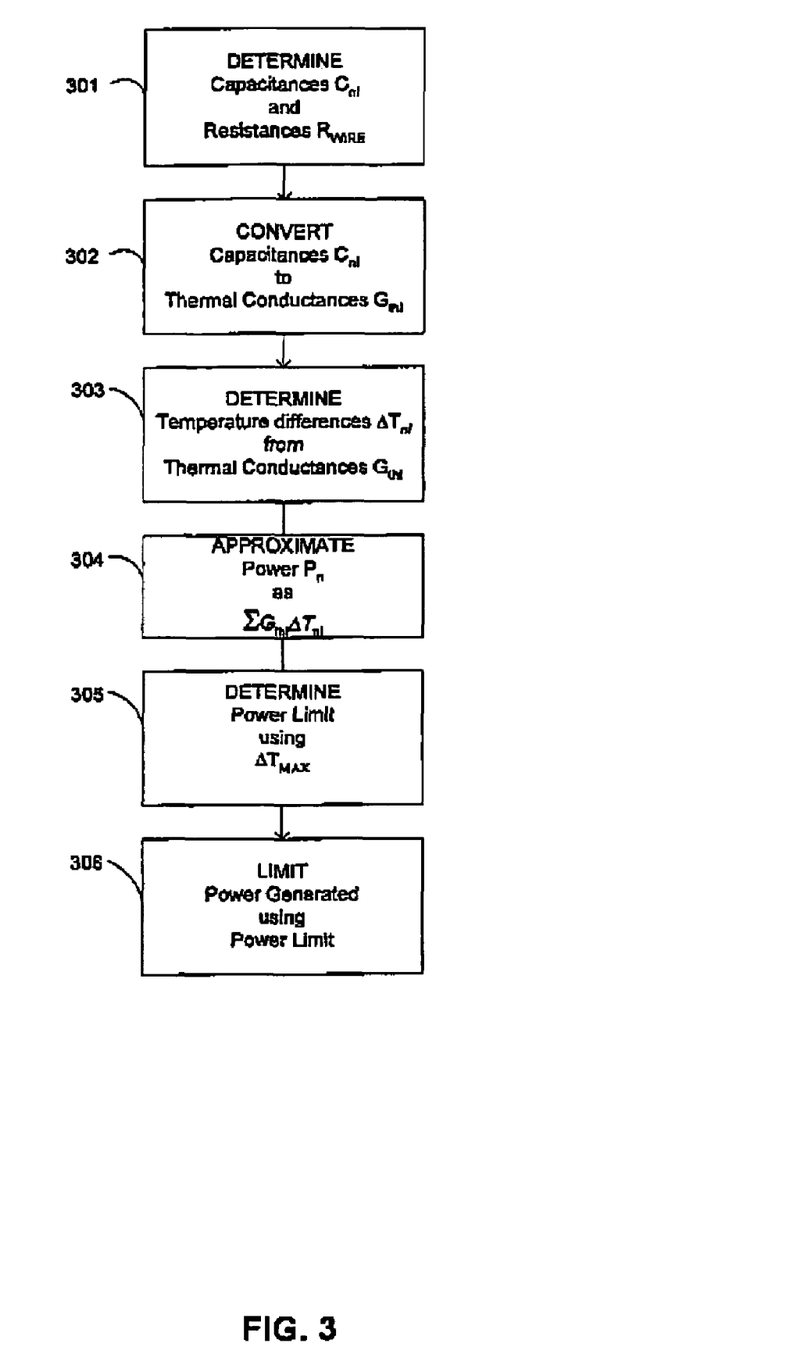
FIG. 3 is an exemplary flow diagram of the method for performing an electromigration check for conductors with alternating current flow adjacent to conductors with direct current flow.

FIG. 3 is an exemplary flow diagram of a method for performing an EM check for conductors with alternating current flow adjacent to conductors with direct current flow. The values for resistances $R_{WIRE}$ and capacitances $C_{ni}$ associated with the conductors are determined in step 301. A non-limiting example of the form in which these capacitances are provided is as individual values of capacitance $C_{ni}$. The values for capacitance $C_{ni}$ are converted into thermal conductances $G_{thi}$ by multiplying each value by the scalar factor F, where F is the ratio of thermal conductivity $\kappa$ to permittivity $\epsilon$ of the material (i.e., $F=\kappa/\epsilon$) at step 302. In step 303, the thermal conductances $G_{thi}$ are used to determine the temperature differences $\Delta T_{ni}$ between conductors. In step 304, the power flow $P_n$ into the nth conductor with direct current flow is approximated by the summation of the product of the temperature differences $\Delta T_{ni}$ and the thermal conductances $G_{thi}$ due to adjacent conductors with alternating current flow. The power limit is determined in step 305 using the maximum temperature $\Delta T_{MAX}$ that ensures reliability of the wire being checked and the expression of Equation (4). This value for the power limit is used to limit the power generated to less than the power limit in step 306.

Figure 4:
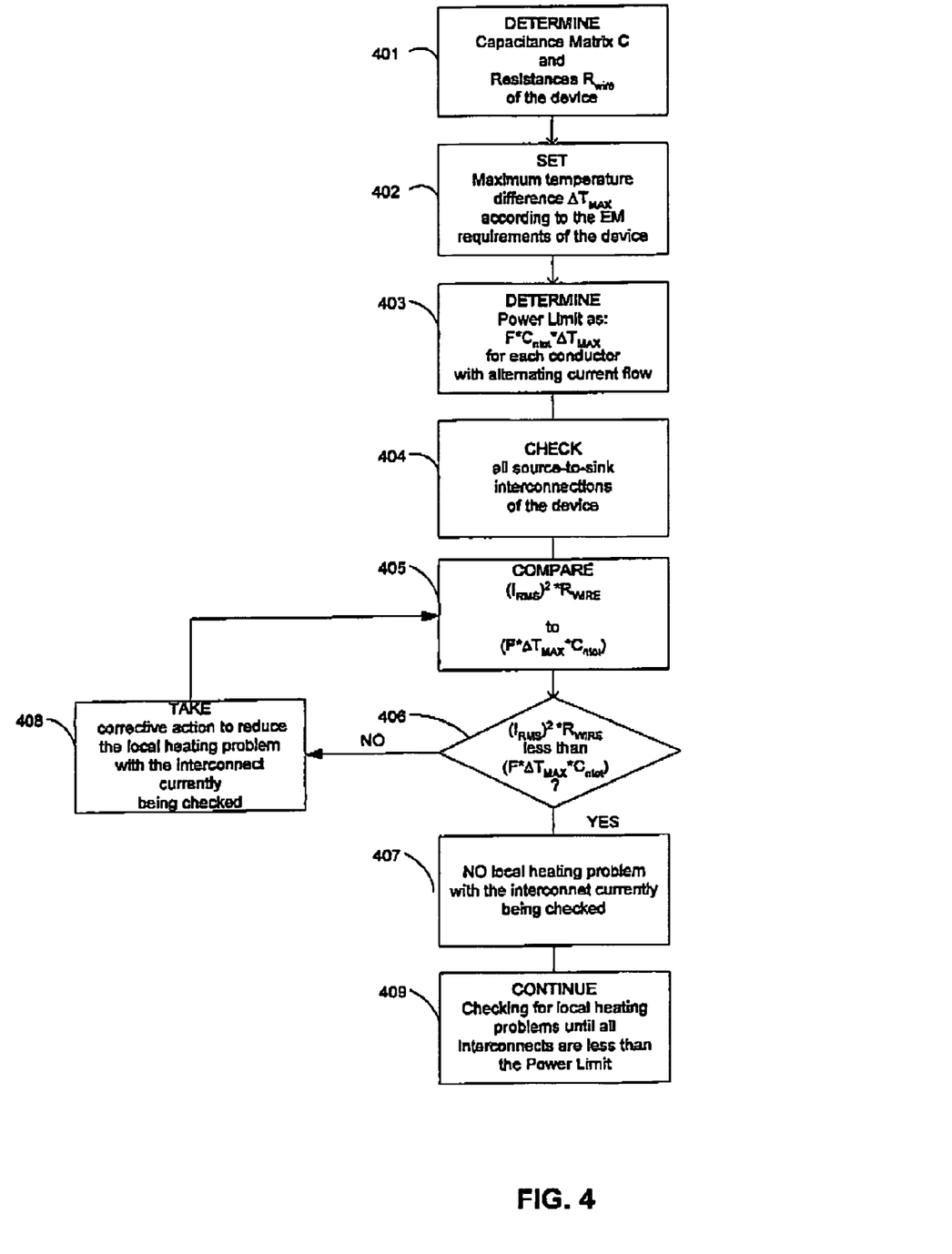
FIG. 4 is an exemplary flow diagram of a method for performing a check of local heating in a device.

FIG. 4 is an exemplary flow diagram of the method for performing a check of local heating in a device. The values for capacitances $C_{ntot}$ and $C_{ni}$ associated with the device are determined in step 401. These capacitances $C_{ni}$ may take the form of individual capacitance values $C_{ni}$ for the device or a capacitance matrix C. The values for capacitance $C_{ni}$ are converted into thermal conductances $G_{thi}$ or a thermal conductance matrix G at step 402. In step 403, thermal conductances $G_{thi}$ or a thermal conductance matrix G and the capacitances $C_{ni}$ or thermal capacitance matrix C are used to determine the temperature differences $\Delta T_{ni}$. In step 404, the power flow $P_n$ into a conductor or wire with direct current flow is approximated by the summation of the product of the temperature differences $\Delta T_{ni}$ between conductors and the thermal conductances $G_{thi}$ due to alternating current flow in adjacent conductors or wires. The power limit is determined in step 405 using $\Delta T_{MAX}$ for the wire, conductor or device being checked by the expression of Equation (4). This value for the power limit is used to limit the power generated in the wires, conductors or a device with alternating current flow adjacent to a wire or conductor with direct current flow in step 406. Step 407 checks to see if the power generated is less than the power limit. If this is the case, there is no local heating problem with the wire, conductor or device and checking of other wires, conductors or devices for local heating problems continues in step 409. However, if the power generated is greater than or equal to the power limit, step 408 takes corrective action (e.g., using a wider conductor or wire width for a segment of the conductor or wire); and step 410 continues checking conductor or wire until the value of the power generated is less than the power limit.

The foregoing description illustrates and describes the present invention. Additionally, the disclosure shows and describes only the preferred embodiments of the invention, but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form or application disclosed herein. Also, it is intended that the appended claims be construed to include alternative embodiments.

The invention claimed is:

1. A method for performing an electromigration check for conductors with alternating current flow adjacent to conductors with direct current flow in an integrated circuit comprising:
   determining resistances $R_{WIRE}$ and a capacitance matrix C for the integrated circuit;
   converting the capacitance matrix C into a thermal conductance matrix G;
   determining temperature differences $\Delta T_{ni}$ between conductors from thermal conductances $G_{thi}$ of the thermal conductance matrix G;
   approximating power flow $P_n$ into conductors with direct current flow due to adjacent conductors with alternating current flow in the integrated circuit from the temperature differences $\Delta T_{ni}$ between conductors and the thermal conductances $G_{thi}$;
   determining a power limit as a function of the maximum temperature difference $\Delta T_{MAX}$ that ensures reliability of the integrated circuit;
   performing the electromigration check by limiting power generated in the conductors with alternating current flow to less than the power limit;
   wherein n and i are conductor numbers; and
   wherein n, ni and thi are numerical subscripts that identify parameters as associated with conductor n, conductor n and conductor i, and a thermal characteristic of conductor i, respectively.

2. The method of claim 1, wherein the thermal conductance matrix G is determined from the product of the capacitance matrix C and a scalar factor F and the scalar factor is given by a ratio of thermal conductivity $\kappa$ to permittivity $\epsilon$.

3. The method of claim 1, wherein the power limit is given by the product of scalar factor F, the total capacitance $C_{ntot}$ and the maximum temperature difference $\Delta\text{-}T_{MAX}$.

4. The method of claim 1, wherein the $I_{RMS}$ value is determined by the expression:

$C_{load}*V_{dd}*\text{frequency}*\text{Switching factor}.$

5. The method of claim 1, wherein the thermal conductances $G_{thi}$ are inputs for a circuit simulator that determines temperature differences between conductors $\Delta T_{ni}$ as outputs of the circuit simulator.

6. The method of claim 1, wherein the capacitance matrix C and resistances $R_{WIRE}$ are determined by using simulation and analysis tools that include capacitance/resistance extraction capabilities.

7. A method for performing an electromigration check for conductors with alternating current flow adjacent to conductors with direct current flow comprising:
   determining resistances $R_{WIRE}$ and capacitances $C_{ni}$ for conductors with alternating current flow and conductors with direct current flow;
   converting the capacitances $C_{ni}$ into thermal conductances $G_{thi}$;
   determining temperature differences $\Delta T_{ni}$ between conductors from the thermal conductances $G_{thi}$;
   approximating power flow $P_n$ into conductors with direct current flow due to adjacent conductors with alternating current flow from the temperature differences $\Delta T_{ni}$ between conductors and thermal conductances $G_{thi}$;
   determining a power limit as a function of a maximum temperature difference $\Delta T_{MAX}$ for the conductors that ensures reliability of the conductors;
   performing the electromigration check by limiting power generated in the conductors with alternating current flow to less than the power limit;
   wherein n and i are conductor numbers; and
   wherein n, ni and thi are numerical subscripts that identify parameters as associated with conductor n, conductor n and conductor i, and a thermal characteristic of conductor i, respectively.

8. The method of claim 7, wherein the thermal conductances $-G_{thi}$ are determined from the product of the capacitances $C_{ni}$ and a factor F is given by a ratio of thermal conductivity $\kappa$ to permittivity $\epsilon$.

9. The method of claim 7, wherein the power limit is given by the product of scalar factor F, the total capacitance $C_{ntot}$ and the maximum temperature difference $\Delta\text{-}T_{MAX}$.

10. The method of claim 7, wherein the $I_{RMS}$ value is determined by the expression:

$$C_{load}*V_{dd}*\text{frequency}*\text{Switching factor.}$$

11. The method of claim 7, wherein the thermal conductances $G_{thi}$ are inputs for a circuit simulator that determines temperature differences between conductors $\Delta T_{ni}$ as outputs of the circuit simulator.

12. The method of claim 7, wherein the capacitances $C_{ni}$ and resistances $R_{WIRE}$ are determined by using simulation and analysis tools that at least include capacitance/resistance extraction capabilities.

13. A method for performing a check of local heating in a device comprising:
   determining resistances $R_{WIRE}$ and at least one of capacitances $C_{ni}$ and a capacitance matrix C for the device;
   determining thermal conductances $G_{thi}$ from the at least one of capacitances $C_{ni}$ and a capacitance matrix C;
   setting a maximum temperature difference $\Delta T_{MAX}$ in accordance with electromigration requirements; determining a power limit $F*C_{ntot}*\Delta T_{MAX}$ as a function of the maximum temperature difference $\Delta T_{MAX}$;
   checking interconnect conductors with alternating current flow to determine if power generated $I_{RMS}*R_{WIRE}^2$ is less than the power limit $F*C_{ntot}*\Delta T_{MAX}$;
   indicating no local heating problem with an interconnect conductor when power generated $I_{RMS}*R_{WIRE}^2$ is less than the power limit $F*C_{ntot}*\Delta T_{MAX}$;
   indicating a local heating problem exist with said interconnect conductor when the power generated $I^{RMS}*R_{WIRE}^2$ is equal to or greater than power limit $F*C_{ntot}*\Delta T_{MAX}$ and taking corrective action to reduce the power generated $I_{RMS}*R_{WIRE}^2$; and
   continuing to check interconnect conductors with alternating current flow until all interconnect conductors have a value for power generated $I_{RMS}*R_{WIRE}^2$ less than the power limit $F*C_{ntot}*\Delta T_{MAX}$;
   wherein n and i are conductor numbers, F is a scalar factor and $C_{ntot}$ is a total capacitance; and
   wherein n, ni and thi are numerical subscripts that identify parameters as associated with conductor n, conductor n and conductor i, and a thermal characteristic of conductor i, respectively, F is a scalar factor, and ntot is a numerical subscript identifying a total value of an associated parameter.

14. The method of claim 13, wherein the thermal conductances $G_{thi}$ are determined from the product of the capacitances $C_{ni}$ and scalar factor F is given by a ratio of thermal conductivity $\kappa$ to permittivity $\epsilon$.

15. The method of claim 13, wherein the power limit is given by a product of scalar factor F, the total capacitance $C_{ntot}$ and the maximum temperature difference $\Delta T_{MAX}$.

16. The method of claim 13, wherein the IRMS value is determined by the expression:

$$C_{load}*V_{dd}*\text{frequency}*\text{Switching factor.}$$

17. The method of claim 13, wherein said thermal conductances $G_{thi}$ are inputs for a circuit simulator that determines temperature differences $\Delta T_{ni}$ as outputs of the circuit simulator.

18. The method of claim 13, wherein the capacitances $C_{ni}$ and resistances $R_{WIRE}$ are determined by using simulation and analysis tools that include capacitance/resistance extraction capabilities.

19. A computer-readable medium having a plurality of computer executable instructions for causing a computer to perform an electromigration check for conductors with alternating current flow adjacent to conductors with direct current flow in an integrated circuit, the computer executable instructions comprising:
   instructions for determining resistances $R_{WIRE}$ and a capacitance matrix C for the integrated circuit;
   instructions for converting the capacitance matrix C into a thermal conductance matrix $-G$;
   instructions for determining temperature differences $\Delta T_{ni}$ between conductors from thermal conductances $G_{thi}$ of the thermal conductance matrix G;
   instructions for approximating power flow $P_n$ into conductors with direct current flow due to adjacent conductors with alternating current flow in the integrated circuit from the temperature differences $\Delta T_{ni}$ between conductors and the thermal conductances $G_{thi}$;
   instructions for determining a power limit as a function of the maximum temperature difference $\Delta T_{MAX}$ that ensures reliability of the integrated circuit;
   instructions for performing the electromigration check by limiting power generated in the conductors with alternating current flow to less than the power limit,
   wherein n and i are conductor numbers; and
   wherein n, ni and thi are numerical subscripts that identify parameters as associated with conductor n, conductor n and conductor i, and a thermal characteristic of conductor i, respectively, F is a scalar factor, and ntot is a numerical subscript identifying a total value of an associated parameter.

20. The computer readable medium of claim 19, wherein the thermal conductance matrix G is determined from the product of the capacitance matrix C and a scalar factor F and the scalar factor is given by a ratio of thermal conductivity $\kappa$ to permittivity $\epsilon$.

21. The computer readable medium of claim 19, wherein the power limit is given by the product of scalar factor F, the total capacitance $C_{ntot}$ and the maximum temperature difference $\Delta T_{MAX}$.

22. The computer readable medium of claim 19, wherein the $I_{RMS}$ value is determined by the expression: $C_{load}*V_{dd}*$frequency*Switching factor.

23. The computer readable medium of claim 19, wherein the thermal conductances $G_{thi}$ are inputs for a circuit simulator that determines temperature differences between conductors $\Delta T_{ni}$ as outputs of the circuit simulator.

* * * * *